United States Patent
Loo et al.

(10) Patent No.: US 9,502,415 B2
(45) Date of Patent: Nov. 22, 2016

(54) METHOD FOR PROVIDING AN NMOS DEVICE AND A PMOS DEVICE ON A SILICON SUBSTRATE AND SILICON SUBSTRATE COMPRISING AN NMOS DEVICE AND A PMOS DEVICE

(71) Applicant: IMEC VZW, Leuven (BE)

(72) Inventors: Roger Loo, Leuven (BE); Jerome Mitard, Bossut-Gottechain (BE); Liesbeth Witters, Linden (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 14/808,459

(22) Filed: Jul. 24, 2015

(65) Prior Publication Data

US 2016/0027779 A1     Jan. 28, 2016

(30) Foreign Application Priority Data

Jul. 25, 2014  (EP) .................................... 14178560

(51) Int. Cl.
*H01L 21/8238*    (2006.01)
*H01L 27/092*    (2006.01)
(Continued)

(52) U.S. Cl.
CPC ..... *H01L 27/0922* (2013.01); *H01L 21/02381* (2013.01); *H01L 21/02532* (2013.01);
(Continued)

(58) Field of Classification Search
CPC ................... H01L 21/02384; H01L 21/28255
USPC ................. 438/222, 284, 429, 938
See application file for complete search history.

(56) References Cited

U.S. PATENT DOCUMENTS 6,649,492 B2   11/2003  Chu et al.
7,091,095 B2    8/2006  Chu
(Continued)

FOREIGN PATENT DOCUMENTS

EP    2 741 320 A1    6/2014

OTHER PUBLICATIONS

Chen et al. "Role of Ge interlayer in the growth of high-quality strain relaxed SiGe layer with low dislocation density," Applied Surface Science, 2011, vol. 257: pp. 2818-2821.
(Continued)

*Primary Examiner* — Chandra Chaudhari
(74) *Attorney, Agent, or Firm* — Knobbe, Martens, Olson & Bear LLP (57) ABSTRACT

The disclosed technology generally relates to complementary metal-oxide-silicon (CMOS) devices, and more particularly to an n-channel metal-oxide-silicon (nMOS) device and a p-channel metal-oxide-silicon (pMOS) device that are under different types of strains. In one aspect, a method comprises providing trenches in a dielectric layer on a semiconductor substrate, where at least a first trench defines an nMOS region and a second trench defines a pMOS region, and where the trenches extend through the dielectric layer and abut a surface of the substrate. The method additionally includes growing a first seed layer in the first trench on the surface and growing a common strain-relaxed buffer layer in the first trench and the second trench, where the common strain-relaxed buffer layer comprises silicon germanium (SiGe). The method further includes growing a common channel layer comprising germanium (Ge) in the first and second trenches and on the common strain-relaxed buffer layer. The properties of the first seed layer and the common strained relaxed buffer layer are predetermined such that the common channel layer is under a tensile strain or is unstrained in the nMOS region and is under a compressive strain in the pMOS region. Aspects also include devices formed using the method.

17 Claims, 9 Drawing Sheets

(51) Int. Cl.
  *H01L 29/10* (2006.01)
  *H01L 21/02* (2006.01)
  *H01L 29/06* (2006.01)
  *H01L 29/165* (2006.01)
  *H01L 29/66* (2006.01)
  *H01L 29/78* (2006.01)

(52) U.S. Cl.
  CPC . *H01L21/02645* (2013.01); *H01L 21/823807* (2013.01); *H01L 21/823814* (2013.01); *H01L 21/823821* (2013.01); *H01L 27/0924* (2013.01); *H01L 29/0653* (2013.01); *H01L 29/1054* (2013.01); *H01L 29/165* (2013.01); *H01L 29/66545* (2013.01); *H01L 29/7848* (2013.01)

(56) References Cited

U.S. PATENT DOCUMENTS

| | | |
|---|---|---|
| 7,301,180 B2 | 11/2007 | Lee et al. |
| 7,790,538 B2 | 9/2010 | Shang et al. |
| 8,481,410 B1 * | 7/2013 | LiCausi .......... H01L 21/823821 438/285 |
| 9,105,741 B2 * | 8/2015 | Chan ............... H01L 21/823412 |
| 2004/0256647 A1 | 12/2004 | Lee et al. |
| 2011/0084308 A1 | 4/2011 | Loh et al. |
| 2011/0147711 A1 | 6/2011 | Pillarisetty et al. |
| 2012/0319211 A1 | 12/2012 | Van Dal et al. |
| 2014/0061801 A1 | 3/2014 | Doornbos et al. |

OTHER PUBLICATIONS

Eneman et al. "Stress Simulations for Optimal Mobility Group IV p- and nMOS FinFETs for the 14 nm Node and Beyond," IEEE Int Electron Devices Meeting, 2012, pp. 1-4.

Extended European Search Report issued on Jan. 20, 2015 in European Application No. 14178560.0.

Myronov et al. "Strain Relaxation and Surface Morphology of Ultrathin High Ge Content SiGe Buffers Grown on Si(001) Substrate," Japanese Journal of Applied Physics, 2007, vol. 46(2): pp. 721-725.

* cited by examiner

METHOD FOR PROVIDING AN NMOS DEVICE AND A PMOS DEVICE ON A SILICON SUBSTRATE AND SILICON SUBSTRATE COMPRISING AN NMOS DEVICE AND A PMOS DEVICE

CROSS-REFERENCE TO RELATED APPLICATIONS

This application claims foreign priority to European patent application EP 14178560.0, filed Jul. 25, 2014, the content of which is incorporated by reference herein in its entirety.

BACKGROUND

Field

The disclosed technology generally relates to complementary metal-oxide-silicon (CMOS) devices, and more particularly to an n-channel metal-oxide-silicon (nMOS) device and a p-channel metal-oxide-silicon (pMOS) device that are under different types of strains.

Description of the Related Technology

In some complimentary metal-oxide-silicon (CMOS) technologies, an n-channel metal-oxide-silicon (nMOS) device and a p-channel metal-oxide-silicon (pMOS) device that are under different types of strains are used. For example a combination of tensile-strained/unstrained and compressively strained channel structures may be formed on a single substrate, for nMOS and pMOS transistor devices, respectively. The different types of strains are employed, e.g., to increase carrier mobilities of the nMOS and pMOS devices.

A prior art solution is to provide different channel materials for the tensile-strained and compressively strained channel structures (channel layers).

However, integrating different materials for the nMOS and pMOS devices can be technologically difficult and expensive. Thus, there exists a need for alternative, less complex methods which allow manufacturing both tensile-strained and compressively strained channel structures with the same channel material on a substrate.

SUMMARY OF CERTAIN INVENTIVE ASPECTS

It is an aim of the present disclosure to provide a method which allows manufacturing both tensile-strained and compressively strained channel structures on a substrate, which is less complex than the prior art.

This aim is achieved according to the disclosure with the method showing the technical characteristics of the first independent claim.

It is another aim of the present disclosure to provide a novel substrate comprising both tensile-strained and compressively strained channel structures.

This aim is achieved according to the disclosure with a method comprising the steps of the second independent claim.

In a first aspect of the present disclosure, a method is disclosed for providing an nMOS device and a pMOS device on a silicon substrate, comprising: providing trenches in a dielectric layer on the silicon substrate, the silicon substrate preferably having a (001) orientation, at least a first trench defining an nMOS region and a second trench defining a pMOS region, the trenches extending through the dielectric layer and abutting a surface of the substrate; growing a first seed layer in the first trench on the surface; growing a common (i.e. present in both nMOS region and pMOS region; hereby the strain-relaxed buffer layer (SRB) is formed in a common process for both nMOS and pMOS region) strain-relaxed buffer layer in the first and the second trench, for instance on the first seed layer in the first trench and on the surface in the second trench, the strain-relaxed buffer layer comprising silicon germanium; growing a common channel layer comprising germanium (Ge) in the first trench and the second trench on the common strain-relaxed buffer layer; wherein the properties of the first seed layer and the common strained relaxed buffer layer are predetermined such that the common channel layer comprises tensile strain or is unstrained in the nMOS region and comprises compressive strain in the pMOS region.

According to some embodiments, the step of providing trenches in a dielectric layer on the silicon substrate, the silicon substrate preferably having a (001) orientation, at least a first trench defining an nMOS region and a second trench defining a pMOS region, the trenches extending through the dielectric layer and abutting a surface of the substrate, for instance comprises providing trenches (a first trench defining an nMOS region and a second trench defining a pMOS region) having sidewalls defined by a dielectric material structure and abutting on the silicon substrate's surface, which preferably has a (001) orientation. In some embodiments, the substrate comprises isolation structures comprising dielectric material structures, and the dielectric material structures comprise shallow trench isolation (STI) structures formed of, e.g., silicon oxide. Providing trenches in the STI comprising substrate can then comprise recessing respective silicon protrusions located in between a respective pair of adjacent STI structures.

According to some embodiments, the predetermined properties of the first seed layer include composition and/or thickness.

According to some embodiments, the method further comprises growing a second seed layer in the second trench on the surface before growing the common strain-relaxed buffer layer on the first and second seed layers; the second seed layer being different from the first seed layer; wherein the properties of the first seed layer, the second seed layer, and the common strained buffer layer are predetermined such that the common channel layer comprises tensile strain or is unstrained in the nMOS region and comprises compressive strain in the pMOS region.

According to some embodiments, the predetermined properties of the second seed layer include composition and/or thickness.

According to some embodiments, the first seed layer and the second seed layer have a different composition and/or thickness.

According to some embodiments, the first seed layer and the second seed layer have a thickness larger than 5 nm. According to some embodiments, the first seed layer and the second seed layer have a thickness within the range of 5 nm to 60 nm.

According to some embodiments, the first seed layer comprises germanium tin (GeSn), silicon germanium tin (SiGeSn) or germanium (Ge).

According to some embodiments, the second seed layer comprises Ge or silicon germanium (SiGe).

According to some embodiments, the common channel layer is a Ge layer.

According to some embodiments, the strain-relaxed buffer layer is constant in composition. In embodiments where the channel layer is formed of Ge, the strain-relaxed buffer layer (SRB) comprises SiGe. In various implementations, the Ge content of the SRB layer is less than 85%, to keep the off-current of MOS devices under control.

In a second aspect of the present disclosure, a device comprising a silicon substrate is disclosed, comprising an nMOS device and a pMOS device, comprising: trenches in a dielectric layer on the silicon substrate, at least a first trench defining an nMOS region and a second trench defining a pMOS region, the trenches extending through the dielectric layer and abutting a surface of the substrate; a first seed layer in the first trench on the surface; a common strain-relaxed buffer layer in the first trench on the first seed layer and in the second trench, the strain-relaxed buffer layer comprising silicon germanium; a common channel layer comprising germanium (Ge) in the first trench and the second trench on the common strain-relaxed buffer layer; wherein the common channel layer comprises tensile strain or is unstrained in the nMOS region and comprises compressive strain in the pMOS region.

According to some embodiments, the silicon substrate further comprises a second seed layer in the second trench on the surface, and below the common strain-relaxed buffer layer; the second seed layer being different from the first seed layer.

According to some embodiments, the first seed layer and the second seed layer have a different composition and/or thickness.

According to some embodiments, the thickness of the buffer layer is between 300 nm and 50 nm.

BRIEF DESCRIPTION OF THE DRAWINGS

The disclosure will be further elucidated by means of the following description and the appended figures.

DETAILED DESCRIPTION OF CERTAIN ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

Throughout the disclosure, it will be understood that an alloy of two or more materials designated by their constituent elements represents an entire range of compositions. For example, it will be understood that silicon germanium (SiGe) represents $Si_xGe_{1-x}$ in which x is greater than zero and less than one. Likewise, germanium tin (GeSn) represents $Ge_xSn_{1-x}$ in which x is greater than zero and less than one, and silicon germanium tin (SiGeSn) represents $Si_xGe_ySn_{1-x-y}$ in which x and y are each greater than zero and less than one.

Throughout the disclosure, it will be understood that a layer or a material that is "strained" can be partially strained or fully strained. Similarly, it will be understood that a layer or a material that is "strain-relaxed" can be partially strain-relaxed or fully strain-relaxed.

Figure 1:
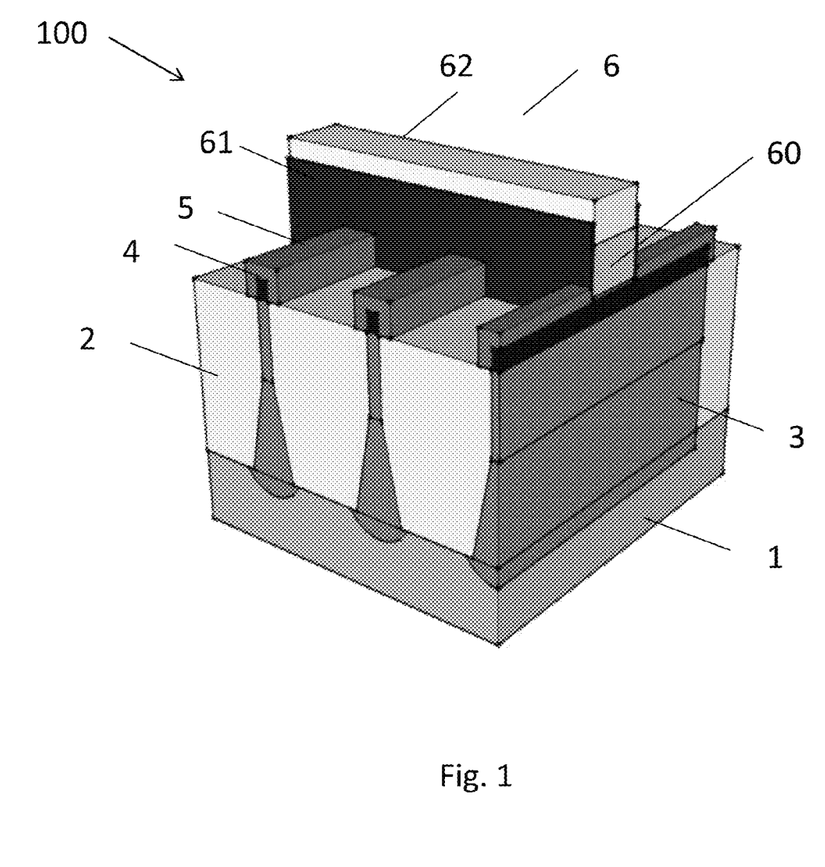
FIG. 1 illustrates a perspective view of a finFET transistor device.

FIG. 1 illustrates a transistor device 100 of the fin field effect transistor (finFET) type. The strained Ge p-finFET structure comprises a strained (stressed) germanium (sGe) channel 4 epitaxially grown on top of a $Si_{1-x}Ge_x$ strain-relaxed buffer (SRB) 3 with $Si_{1-y}Ge_y$ (or $Ge_{1-z}Sn_z$) stressors 5 on the Source/Drain areas. A gate structure 6 comprising a gate stack 60 and being laterally delimited by spacer structures 61 is provided perpendicularly over the channel 4. The stressors 5 are separated from the gate stack 60 by these spacer structures 61. The $Si_{1-x}Ge_x$ strain-relaxed buffer 3 and channel layers 4 are grown within recessed trenches 10 between shallow trench isolation (STI) structures (in another view, within trenches in a dielectric layer) on the substrate's surface on a silicon substrate. The STI structures are typically formed by etching trenches in a main surface of a silicon wafer or substrate, and afterwards filling these trenches with an oxide. Typically a flattering step is then performed in order to expose the silicon protrusions in between the oxide-filled trenches (STI structures). The silicon protrusions are then recessed in between the STI structures, and fin structures are grown within the resulting trenches.

A similar structure is targeted by embodiments of the present disclosure; one, two or more types of transistors can formed on a substrate, each of the transistors comprising the same SRB layer 3 and channel layer 4 in between respective STI structures formed as described above for the prior art. The strain and other characteristics of the respective channels 4 of the different types of transistors are determined using one or more seed layers 7, 71, 72 grown on the silicon substrate 1 surface in the trench before growing the common SRB layer 3. It will be appreciated by the skilled person that the effect of a certain composition and/or thickness of a seed layer 7, 71, 72 on the respective channel can be tested and simulated. The required values of composition and thickness of the seed layers 7, 71, 72 can thus be predetermined for giving final transistor (channel) requirements. This is illustrated in FIG. 3 and FIG. 4.

Figure 3:
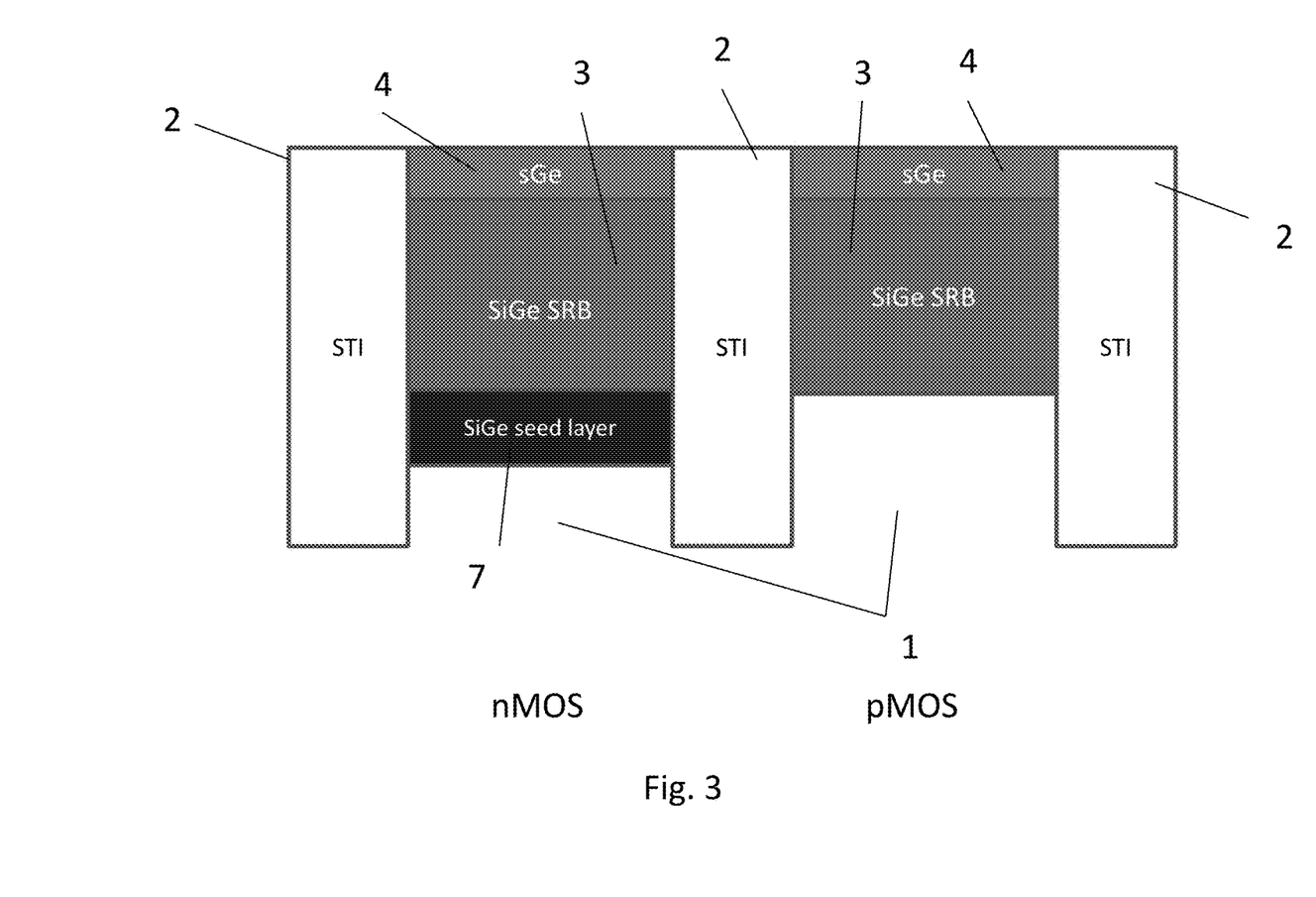
FIG. 3 illustrates a first embodiment of the present disclosure.

In FIG. 3, an embodiment is illustrated in which a silicon substrate has formed thereon an nMOS device and a pMOS device. The illustrated device comprises: trenches in a dielectric layer 2 on a silicon substrate 1, at least a first trench defining an nMOS region and a second trench defining a pMOS region, the trenches extending through the dielectric layer 2 and abutting a surface of the substrate 1; a first seed layer 7 in the first trench on the surface; a common strain-relaxed buffer layer 3 in the first trench on the first seed layer 7 and in the second trench on the silicon substrate surface, the strain-relaxed buffer layer 3 comprising silicon germanium; a common channel layer 4 comprising germanium (Ge) in the first trench and the second trench on the common strain-relaxed buffer (SRB) layer 3; wherein the common channel layer 4 comprises tensile strain or is unstrained in the nMOS region and comprises compressive strain in the pMOS region. It will be understood herein that a "common" layer or a material does not necessarily mean that the layer or the material formed on different regions are identical. For example, while the common SRB layer 3 is formed, e.g., simultaneously formed in both nMOS and pMOS regions, the SRB layers 3 formed on nMOS and pMOS regions may be subject to different types and/or amounts of strain. In addition, while simultaneously formed with nominally the same amount of material, the SRB layers 3 formed on nMOS and pMOS regions may have different compositions and thicknesses. This is because under some circumstances, the composition and/or thicknesses can depend on factors such as strain during growth.

Figure 4:
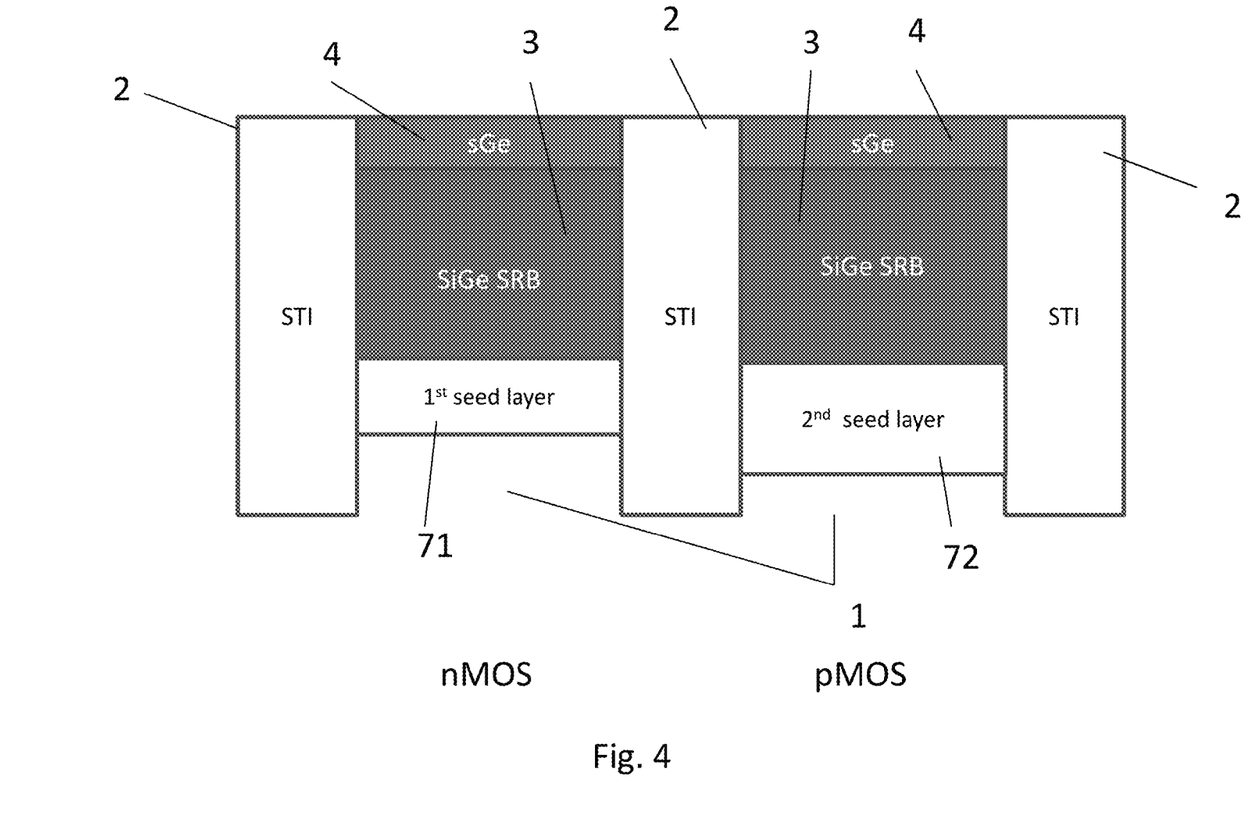
FIG. 4 illustrates a further embodiment of the present disclosure.

FIG. 4 illustrates another embodiment of the present disclosure. The embodiment is similar to the embodiment described in relation with FIG. 3 and further comprises a second seed layer 72 in the second trench on the substrate surface, and below the common strain-relaxed buffer layer 3; the second seed layer 72 being different from the first seed layer 71. The first seed layer 71 and the second 72 layer preferably have a different composition and/or thickness.

Figure 2:
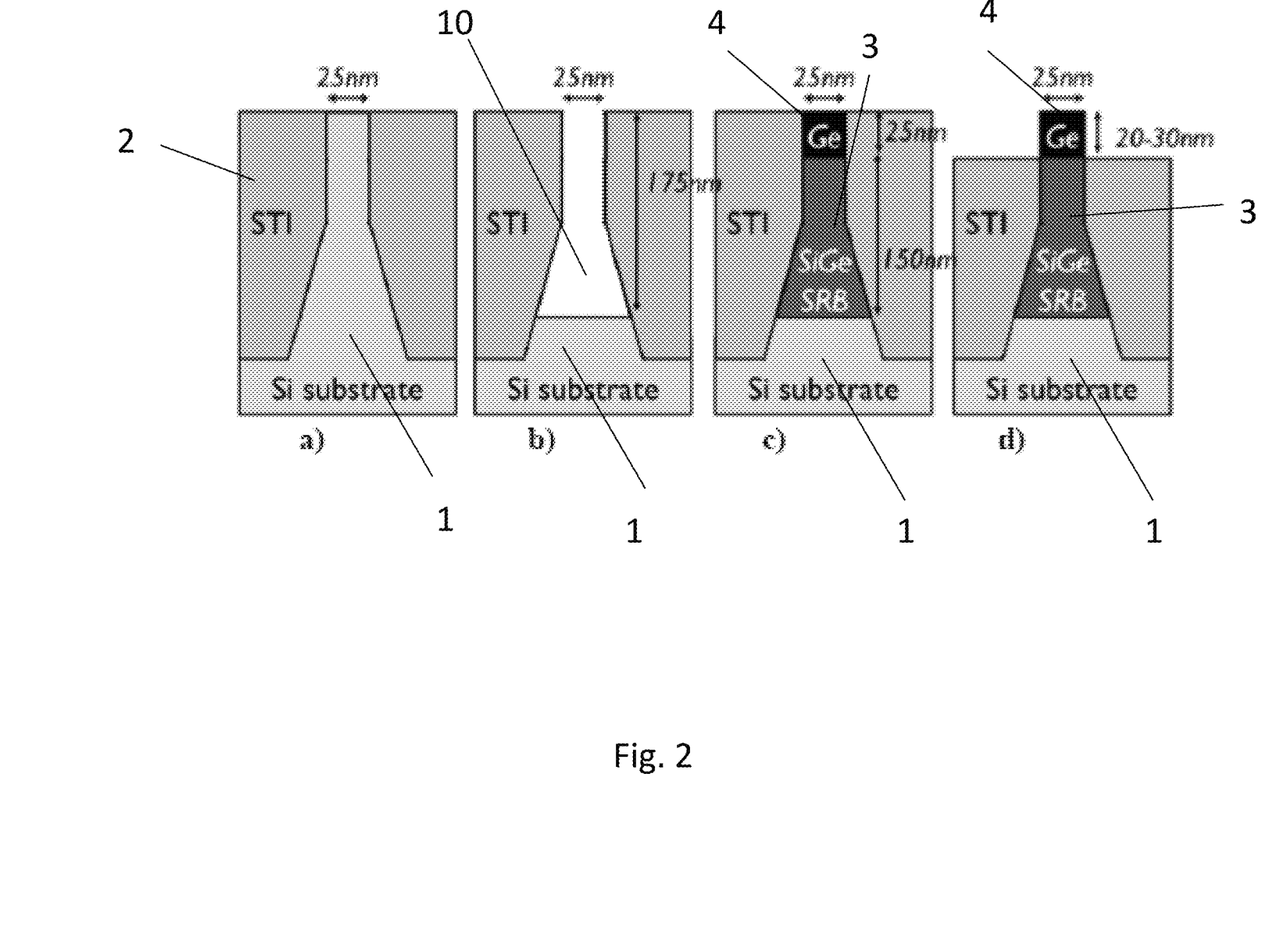
FIG. 2 illustrates a fabrication scheme for the finFET device as illustrated in FIG. 1.

FIG. 2 illustrates a fabrication scheme for a device as illustrated in FIG. 1. A $Si_{0.25}Ge_{0.75}$ SRB layer 3 underneath a 20-30 nm high sGe fin 4 provides a good balance between strain-enhanced mobility and quantum-well confinement on one hand, and limited risk for channel strain relaxation on the other. Starting from a 300 mm bulk Si finFET (100) wafers (FIG. 2 (a)), a fin replacement process was used to fabricate the targeted devices. After the removal of the native oxide by an wet HF-treatment and a conventional pre-epi bake, typically 2 min at 800° C., Si was recessed by in-situ HCl vapor etching (FIG. 2 (b)) resulting in trenches 10 abutting on the silicon surface and which for instance do not extend below the STI structures (or not below the lower surface of the STI structures/dielectric layer). The $Si_{1-x}Ge_x$ SRB layer 3 and the sGe channel 4 were selectively grown on top of the recessed Si surface (FIG. 2 (c)). Pre-epi bake, Si recess and SiGe/Ge-channel regrowth is done in one sequence. Alternatively, Si recess can be done ex-situ using a wet-chemical etching solution. The strained Ge fin structures appears after conventional oxide recess (FIG. 2(d)), e.g. by using a conventional wet-chemical treatment in an HF-based solution.

In other embodiments of the present disclosure, similar fabrication scheme is followed. The difference is the regrown (or regrowing of the) structure, which consists of the deposition of a $Si_{1-y}Ge_y$-seed/$Si_{1-x}Ge_x$/Ge-channel (or Ge-seed/$Si_{1-x}Ge_x$/Ge-channel, or $Ge_{1-y}Sn_y$-seed/$Si_{1-x}Ge_x$/Ge-channel). Again, pre-epi bake, Si recess and SiGe/Ge-channel regrowth can be done either in one sequence or in two separate steps. However, if different seed layers are requested for n- and p-devices (or if only the n-device contains a seed layer), then Si recess and re-growth cannot be combined in one epi sequence. The deposition of different seed layers for nMOS and pMOS then needs to be done separately.

In some embodiments, the method comprises: providing trenches in a dielectric layer on the silicon substrate, at least a first trench defining an nMOS region and a second trench defining a pMOS region, the trenches extending through the dielectric layer and abutting a surface of the substrate; growing a first seed layer in the first trench on the surface; growing a common strain-relaxed buffer layer in the first and the second trench, the strain-relaxed buffer layer comprising silicon germanium; growing a common channel layer comprising germanium (Ge) in the first trench and the second trench on the common strain-relaxed buffer layer; wherein the properties of the first seed layer an the common strained relaxed buffer layer are predetermined such that the common channel layer comprises tensile strain or is unstrained in the nMOS region and comprises compressive strain in the pMOS region.

For the purpose of illustrating the aspects of the present disclosure, a $Si_{1-x}Ge_x$ SRB layer 3 with a Ge content of about 75% was grown.

Figure 5:
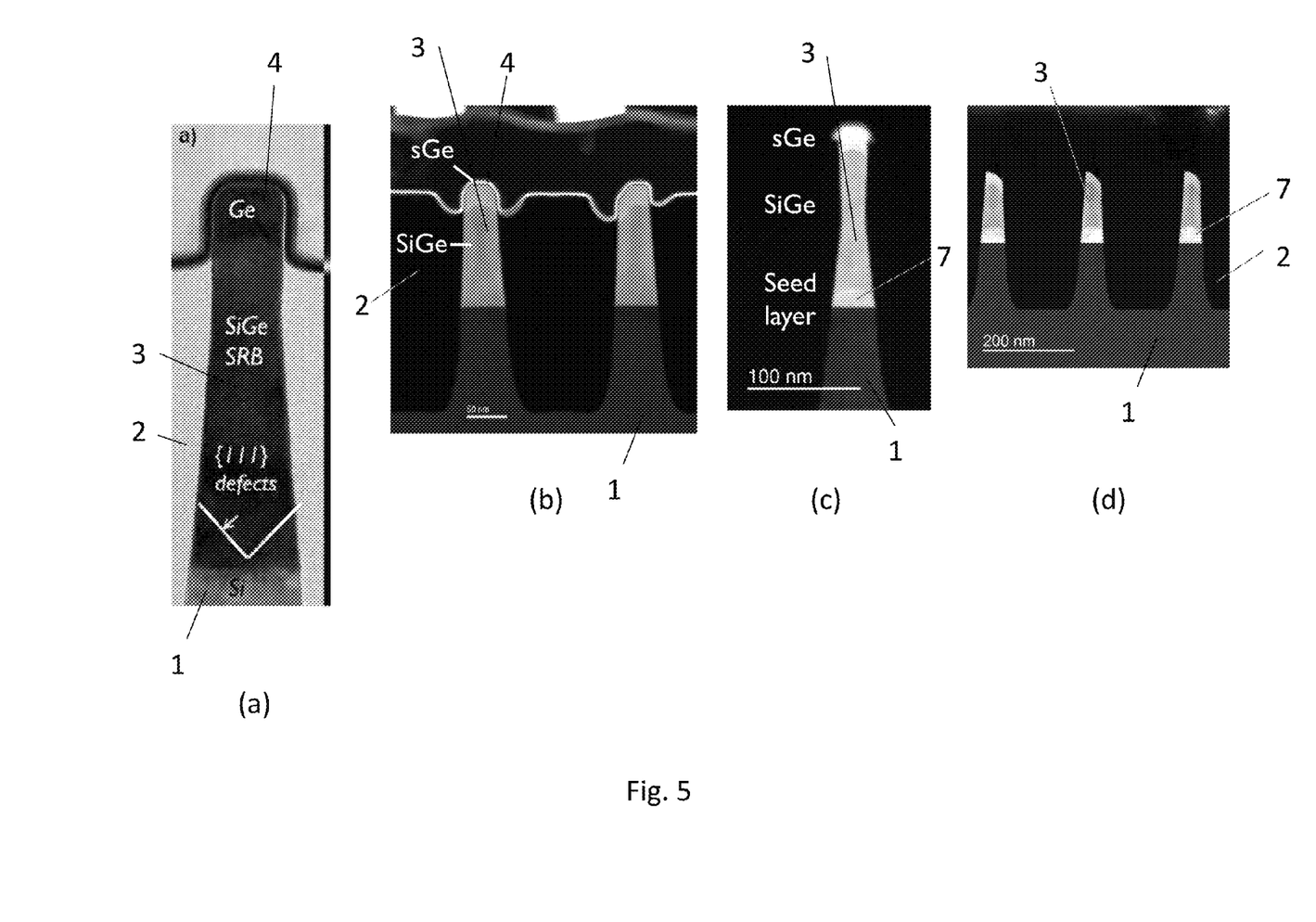
FIG. 5 shows pictures allowing a comparison of material quality across the trench for sGe-cap/relaxed SiGe without/with seed layers.

FIG. 5 (a) to (d) show pictures allowing a comparison of material quality across the trench for sGe-cap/relaxed SiGe without/with seed layers.

FIG. 5 (a) shows a cross-sectional transmission electron microscopy (XTEM) image of a conventional structure. The different epi layers are indicated (SiGe SRB grown on top of the Si substrate and the sGe channel on top of the SiGe SRB). The SiGe-SRB is embedded in the isolating oxide from the STI. The picture has been taken after further device fabrication. The dark line, reflects the high k gate dielectric. The XTEM image is taken across a sGe fin taken on a 25 nm wide structure, which shows that defects are confined in the lower part of the strain-relaxed $Si_{0.25}Ge_{0.75}$. However, it has to be pointed out that this defect trapping at the STI side walls is limited to one direction as it does not occur along the trench. The $Si_{0.25}Ge_{0.75}$ SRB is 92% relaxed according to XRD-RSM X-ray diffraction reciprocal space mapping (XRD-RSM).

FIG. 5 (b) is a high-angle annular dark-field imaging scanning transmission electron microscopy (HAADF-STEM) image taken on a similar sample, which shows that the $Si_{0.25}Ge_{0.75}$ SRB has a slight non-uniformity in composition, which is reflected by the different contrast close to the edge versus the center of the trench. This slight Ge non-uniformity (±3% as confirmed by EDS, Energy-dispersive X-ray spectroscopy) is explained by facet formation during $Si_{0.25}Ge_{0.75}$ Selective epitaxial growth. The Ge incorporation varies as function of the surface orientation of the growing surface and is higher on (111) surfaces than on (001) surfaces. In HAADF-STEM images, the high-k gate dielectric is seen as the white line which goes over the sGe fin and the STI surface.

FIGS. 5(c) and 5(d) show the structure with a SiGe (80-85% Ge) and a Ge seed layer, respectively, before further processing is performed (e.g. before providing the high-k dielectric).

The specific shape of the interface seed/SiGe SRB is given by the chosen process conditions. It varies as function of the deposition temperature, pressure, deposition rate etc. and can be further affected by a thermal treatment after growing the seed layer.

FIG. 5(c) shows a different shape of the vertical side walls of the SiGe layer. In fact, it reflects the curvature of the Si/oxide interface of the incoming STI wafer. The curvature of the side wall of the STI oxide is given by the STI fabrication scheme and not affected by the epitaxial growth process. It is noted that for the case where the Si recess is done by a wet-chemical recess (instead of HCl vapor etching), the pre-epi HF treatment to remove the native oxide from the starting surface is also done after the Si-recess. This may result in a slight lateral etching of the STI oxide (widening of the fin).

Figure 6:
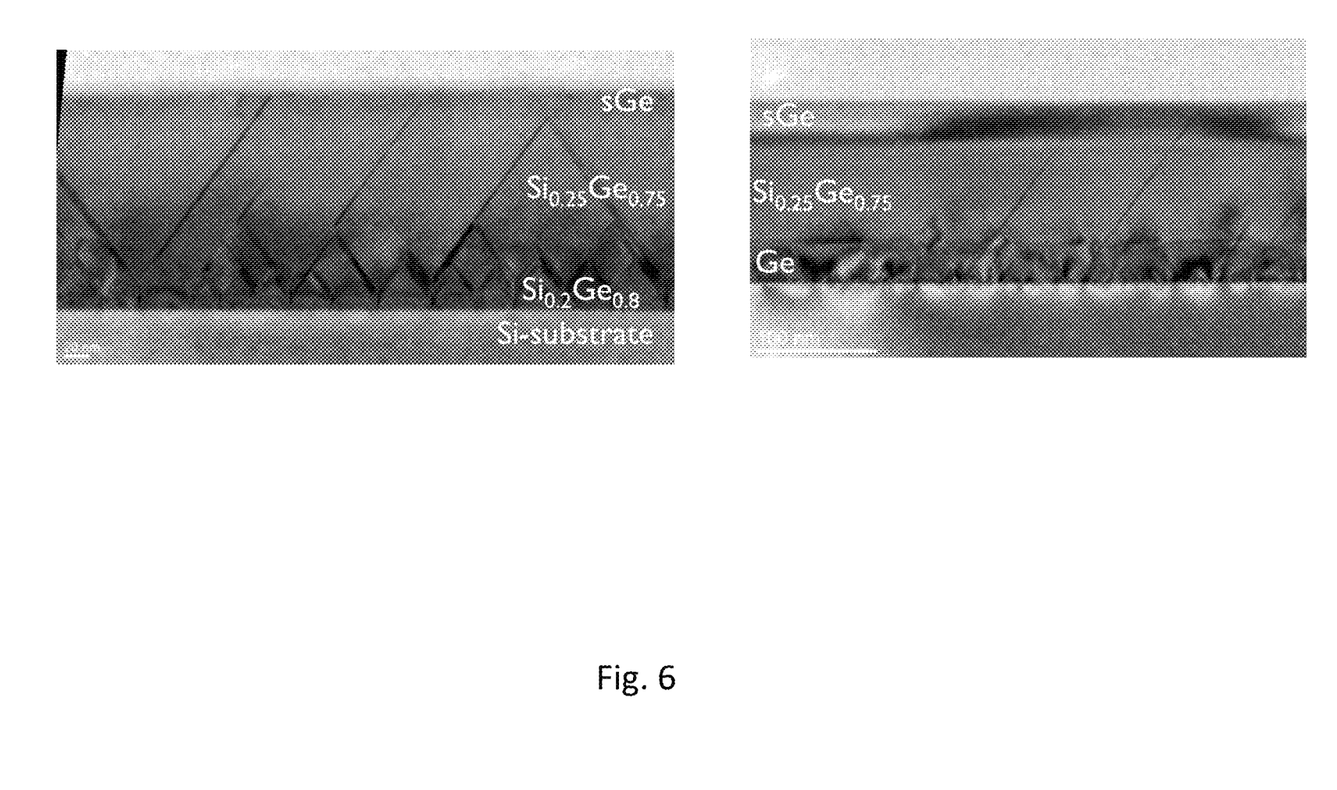
FIG. 6 illustrates the effect of the seed layer on defect trapping in bottom part of the SiGe virtual substrate (along the trench).

FIG. 6 illustrates the effect of the seed layer on defect trapping in bottom part of the SiGe virtual substrate (along the trench). The single SiGe SRB, as in the prior art, is replaced by a double layer comprising the seed layer and the SiGe SRB, which is in the given example grown at two different temperatures. The first layer contains a higher Ge content (80% up to pure Ge, compared to 75% for the SiGe SRB) and is preferably grown at a lower temperature.

The two step approach results in a higher degree of relaxation of the SiGe SRB. The higher degree of relaxation of the SiGe SRB reduces the driving force for the Ge channel to relax and as a result it allows the deposition of a defect free Ge channel layers with a higher layer thickness and an improved surface morphology (less rough).

Figure 7:
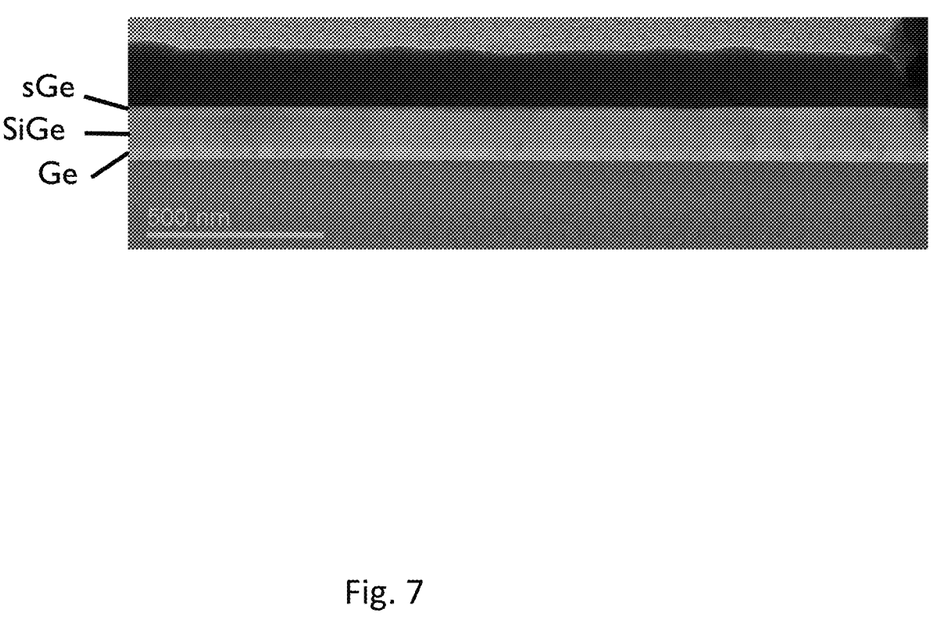
FIG. 7 demonstrates layer thickness uniformity along the trench.

FIG. 7 demonstrates layer uniformity along the trench. The figure shows an XTEM image taken in measurement conditions enabling a clear recognition of the individual layers. The figure confirms the lateral uniformity of the Ge seed layer grown on top of the Si substrate, as well as the $Si_{0.25}Ge_{0.75}$ strain-relaxed buffer and the Ge channel which have been subsequently grown on top of the Ge seed layer.

Figure 8:
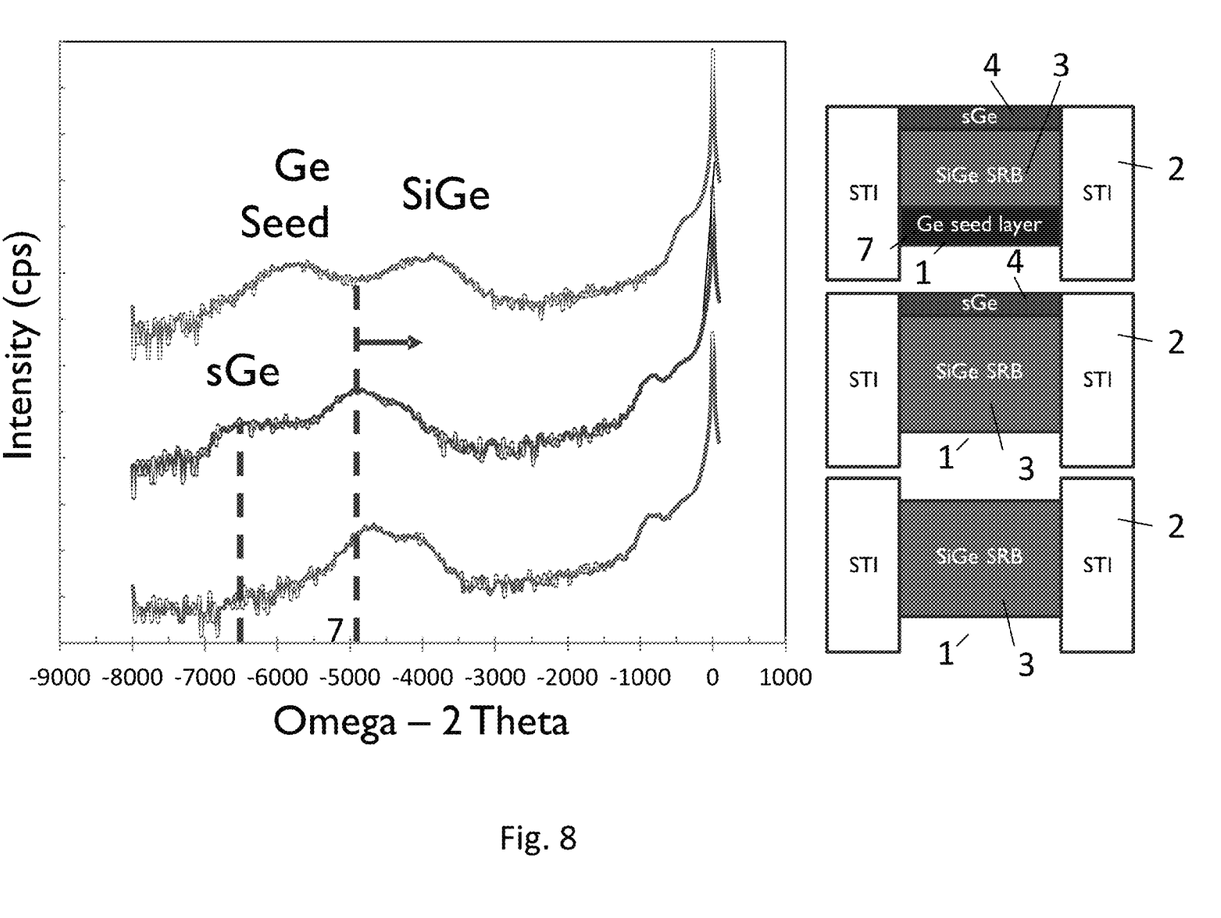
FIG. 8 illustrates the controlling of the strain state in the sGe channel by implementation of a seed layer as demonstrated by XRD.

FIG. 8 illustrates the controlling of the strain state in the sGe channel by implementation of a seed layer as demonstrated by X-ray diffraction (XRD).

The degree of relaxation is measured by means of X-Ray Diffraction (XRD) measurements. For layers with a known composition, the peak position as measured in Omega-2Theta scans reflects the strain state of the specific layer. The peak at 0° comes from the Si bulk substrate.

The shown XRD scans have been measured on STI patterned wafers. The XRD scans for epi layers as shown in the schemes on the right side are being compared. As the measurement spot is relative large, and much larger than the individual window dimensions, the XRD result reflects the weighted average coming from all different structures. The main part of these XRD spectra is coming from relative large windows (~80×80 $\mu m^2$).

The lower XRD curve has been measured on the $Si_{0.3}Ge_{0.7}$ SRB. The peak position (~5000) indicates that the SRB is partially relaxed. The middle curve has been measured on a $Si_{0.3}Ge_{0.7}$-SRB/sGe-channel double layer. The peak reflecting the $Si_{0.3}Ge_{0.7}$ SRB is at the same position, which indicates that the sGe-channel growth does not affect the strain state of the SiGe SRB. In fact, the sGe is grown at relative low temperatures enabling the deposition of a fully strained Ge layer with a thickness above the critical thickness for layer relaxation. Because of the low growth temperature during sGe growth, the SiGe SRB does not further relax while the sGe is being grown. The peak position of the sGe reflects the presence of compressive strain in this layer, which is confirmed by Reciprocal Space Mapping results.

Adding a Ge seed layer underneath the $Si_{0.3}Ge_{0.7}$ SRB does change the XRD result (upper curve). The SiGe peak position moves to lower angles, indicating a smaller 'out-of-plane' lattice constant, or in other words, a higher degree of relaxation of the $Si_{0.3}Ge_{0.7}$ SRB. In fact, the peak position of the $Si_{0.3}Ge_{0.7}$ layer indicates that the layer is slightly tensile strained. Thus, the strain state of the SiGe SRB is affected by the underlying seed layer. For the upper curve, the Ge peak position is given by a combination of the Ge seed layer and the Ge channel. The Ge seed layer is directly grown on Si (large mismatch), and the layer is sufficiently thick (30 nm-80 nm) to expect a full relaxation of the Ge seed layer. The $Si_{0.3}Ge_{0.7}$ is lattice matched to the underlying Ge, and this will also be the case for the Ge-channel. This explains why the Ge peak position moved to smaller angles. Indeed, when going from strained to relaxed Ge, the out of plain lattice constant is reduced.

As device scaling proceeds, the thickness dimensions of transistor devices will be reduced. This includes a scaling of the STI thickness, which is nominally in the order of 250 nm-350 nm and which will be reduced to values smaller than 150 nm. As a consequence, the Si recess and the SiGe SRB stack grown afterwards will also need to be reduced in thickness.

Figure 9:
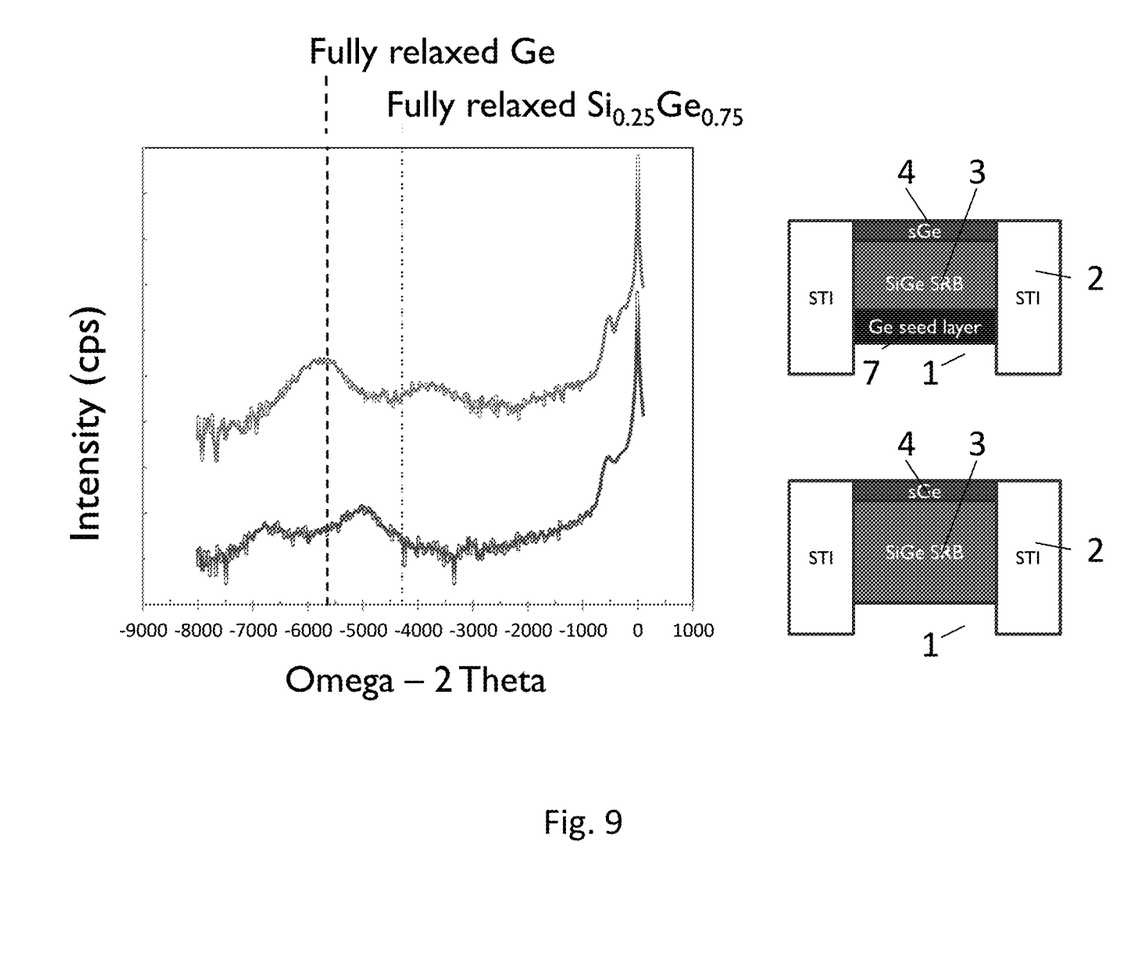
FIG. 9 illustrates scalability of the concept according to embodiments of the present disclosure to future device nodes.

FIG. 9 shows a comparison of XRD scans for SiGe-SRB/Ge-channel epi stacks. The lower and upper curves are made for samples respectively without and with a Ge seed layer. With respect to the examples described in relation with FIGS. 5 to 8, the thickness of the (Ge seed layer+SiGe) has been reduced from about 120 nm-150 nm down to a value smaller than 80 nm. The expected peak positions for fully relaxed SiGe and fully relaxed Ge are indicated by dotted lines.

Again, for the sample without seed layer, the XRD results shows that the $Si_{0.3}Ge_{0.7}$ is only partially relaxed (peak position at larger angles than expected for fully relaxed layers). Adding a Ge seed layer under the SiGe SRB affects the degree of strain relaxation. The $Si_{0.3}Ge_{0.7}$-XRD peak position moves to smaller angles, and its value indicates the presence of tensile strain in the SiGe SRB.

The Ge channel grows lattice matched to the underlying layer. This is because of its limited thickness (<30 nm) and the limited lattice mismatch with the underlying layer. In the first sample (no seed), the Ge-channel grows lattice matched to the (partially) relaxed SiGe and the Ge layer is compressively strained. In the $2^{nd}$ sample, the Ge-channel is also lattice matched to the underlying SiGe, whose in-plane lattice constant is now larger, meaning less strain in the Ge. In the given example, the lattice constant of the SiGe (and therefore, of the Ge-channel) are given by the Ge seed layer, meaning that the Ge-channel is unstrained.

This shows that the concept is scalable to future device needs/thinner SiGe layers. This is of importance, because without seed layer it becomes for thinner SiGe harder to obtain a sufficiently high degree of relaxation in the SiGe SRB.

The seed layer affects the degree of relaxation of the SiGe SRB. Different degrees of relaxation can be obtained by adjusting the thickness and composition of the seed layer.

For instance, with a sufficiently thin Ge seed layer, an incomplete relaxation of the seed layer can be obtained. This results in a slightly smaller in-plane lattice constant in the SiGe SRB layer, such that the strain state in the channel layer can be adjusted. The seed layer is therefore preferably smaller than 20 nm, or smaller than 5 nm.

For instance, when using SiGe instead of Ge as a seed layer, while having a higher Ge content in the seed layer (for instance in between 70% to 100%) than in the SiGe SRB, a slightly smaller in-plane lattice constant in SiGe-SRB results, such that the strain state in the Ge channel can be tuned by adjusting the composition of the seed layer. A low level of compressive strain in the channel layer can thus be set.

For instance, when using GeSn as a seed layer instead of Ge, an even larger in-plane lattice constant in SiGe-SRB exist, resulting in tensile strain in Ge channel. Alternatively, another semiconductor material with a larger lattice constant as the Ge channel, such as $Si_xGe_{1-x-y}Sn_y$ with appropriate Si and Sn compositions enables to deposit tensile strained Ge-channels.

For instance, when no seed layer is provided, compressive strain is introduced in the channel layer based on the Ge content and the degree of relaxation of the SiGe SRB layer.

It will be appreciated that it has been shown that the stress state of a channel layer on top of a SRB layer on top of a substrate can be tuned and can thus be predetermined by providing a seed layer in between the substrate and the SRB layer, and selecting an appropriate thickness and/or composition of the seed layer.

According to some embodiments, no seed layer is applied for pMOS (resulting in compressive strain in a Ge channel), in combination with a Ge seed layer (resulting in an unstrained Ge channel in nMOS) or with a GeSn (or SiGeSn) seed layer (resulting in a tensile strained Ge channel in nMOS).

It will also be appreciated that the use of different seed layers, or a combination of a seed layer and no seed layer, in nMOS and pMOS areas enables to obtain simultaneously the requested different strain levels in the Ge nMOS and pMOS devices, while using the same SiGe SRB layer growth and channel growth.

While certain embodiments of the inventions have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A method of providing an nMOS device and a pMOS device on a silicon substrate, the method comprising:
    providing trenches in a dielectric layer on the silicon substrate, the trenches including at least a first trench defining an nMOS region and a second trench defining a pMOS region, the trenches extending through the dielectric layer and abutting a surface of the substrate;
    growing a first seed layer in the first trench on the surface;
    growing a common strain-relaxed buffer layer in the first trench and in the second trench, the common strain-relaxed buffer layer comprising silicon germanium (SiGe); and
    growing a common channel layer comprising germanium (Ge) in the first and second trenches and on the common strain-relaxed buffer layer,
    wherein the properties of the first seed layer and the common strained relaxed buffer layer are predetermined such that the common channel layer is under a tensile strain or is unstrained in the nMOS region and is under a compressive strain in the pMOS region.

2. The method according to claim 1, wherein the predetermined properties of the first seed layer include at least one of a composition and a thickness.

3. The method according to claim 1, further comprising growing a second seed layer different from the first seed layer in the second trench and on the surface before growing the common strain-relaxed buffer layer, wherein the properties of the first seed layer, the second seed layer, and the common strained buffer layer are predetermined such that the common channel layer is under the tensile strain or is unstrained in the nMOS region and is under the compressive strain in the pMOS region.

4. The method according to claim 3, wherein the predetermined properties of the second seed layer include at least one of a composition and a thickness.

5. The method according to claim 4, wherein the first seed layer and the second seed layer have different compositions and/or thicknesses.

6. The method according to claim 5, wherein each of the first seed layer and the second seed layer has a thickness greater than 5 nm.

7. The method according to claim 1, wherein the first seed layer is formed of a material selected from the group consisting of germanium tin (GeSn), silicon germanium tin (SiGeSn) and germanium (Ge).

8. The method according to claim 5, wherein the second seed layer is formed of germanium (Ge) or silicon germanium (SiGe).

9. The method according to claim 1, wherein the strain-relaxed buffer layer is constant in composition in a vertical direction.

10. A method of fabricating a semiconductor device, comprising:
    providing a semiconductor substrate comprising a plurality of fin structures each extending in a first lateral direction and interposed in a second lateral direction between adjacent dielectric isolation regions;
    removing and replacing portions of a substrate material of the fin structures with a buffer material having a first equilibrium lattice constant, wherein after removing and before replacing the portions of the substrate material, a seed layer having a third equilibrium lattice constant is formed on remaining portions of the substrate material of a first subset of the fin structures, wherein thicknesses and compositions of the seed layer and the buffer material causes the buffer material of the first subset of the fin structures to undergo a strain relaxation; and
    forming a plurality of channel structures each extending in the first direction and on the buffer material of the fin structures, the channel structures being formed of a channel material having a second equilibrium lattice constant.

11. The method of claim 10, wherein the semiconductor substrate material is formed of silicon, the buffer material is formed of SiGe and the channel material comprises Ge at a higher concentration than the buffer material.

12. The method of claim 11, wherein the composition and the thickness of the buffer material is such that the buffer material of a second subset of the fin structures is strained without undergoing a strain relaxation.

13. The method of claim 12, wherein a relaxed lattice constant of a relaxed buffer material of the first subset of fin structures is the same as or less than the second equilibrium lattice constant such that first channel structures formed on the strain-relaxed buffer material are unstrained or tensile-strained, and wherein a strained lattice constant of the strained buffer material of the second subset of fin structures is greater than the second equilibrium lattice constant such that second channel structures formed on the strained buffer material are compressively strained.

14. The method of claim 13, further comprising, after removing and before replacing the materials of the fin structures, forming a second seed layer on remaining portions of the substrate material of the second subset of the fin structures, wherein the second seed layer has a fourth equilibrium lattice constant different from the first to third equilibrium lattice constants and compositions of the second seed layer and the buffer material causes the buffer material of the second subset to undergo a second strain relaxation in an amount that is different from the strain relaxation of the buffer material of the first subset.

15. The method of claim 13, further comprising forming n-channel transistors using unstrained or tensile-strained first channel structures and forming p-channel transistors using compressively strained second channel structures.

16. The method of claim 13, wherein the first seed layer is formed of a material selected from the group consisting of germanium tin (GeSn), silicon germanium tin (SiGeSn) and germanium (Ge).

17. The method of claim 14, wherein the second seed layer is formed of germanium (Ge) or silicon germanium (SiGe).

* * * * *